US012630707B2

(12) United States Patent
Ikeda

(10) Patent No.: US 12,630,707 B2
(45) Date of Patent: May 19, 2026

(54) RESIN COMPOSITION FOR SEALING OPTICAL SEMICONDUCTOR, RESIN MOLDED PRODUCT FOR SEALING OPTICAL SEMICONDUCTOR, OPTICAL SEMICONDUCTOR SEALING MATERIAL, AND OPTICAL SEMICONDUCTOR DEVICE

(71) Applicant: NITTO DENKO CORPORATION, Ibaraki (JP)

(72) Inventor: Jun Ikeda, Ibaraki (JP)

(73) Assignee: NITTO DENKO CORPORATION, Osaka (JP)

(*) Notice: Subject to any disclaimer, the term of this patent is extended or adjusted under 35 U.S.C. 154(b) by 947 days.

(21) Appl. No.: 17/884,415

(22) Filed: Aug. 9, 2022

(65) Prior Publication Data

US 2023/0071071 A1 Mar. 9, 2023

(30) Foreign Application Priority Data

Aug. 16, 2021 (JP) ................................ 2021-132268

(51) Int. Cl.

| | |
|---|---|
| ***C08L 63/00*** | (2006.01) |
| ***C08K 5/09*** | (2006.01) |
| ***C09K 3/10*** | (2006.01) |
| ***H10H 20/854*** | (2025.01) |

(52) U.S. Cl.

CPC ................ *C08L 63/00* (2013.01); *C08K 5/09* (2013.01); *C09K 3/1006* (2013.01); *H10H 20/854* (2025.01)

(58) Field of Classification Search

None

See application file for complete search history.

(56) References Cited

U.S. PATENT DOCUMENTS

2009/0203822 A1 8/2009 Shiobara et al.
2011/0251305 A1 10/2011 Ueno et al.
2012/0299039 A1 11/2012 Uchida et al.
2018/0190870 A1* 7/2018 Sung .................... H10H 20/811
2018/0231414 A1 8/2018 Tsukagoshi et al.
2020/0116860 A1 4/2020 Lai et al.
2020/0135991 A1 4/2020 Lin et al.

FOREIGN PATENT DOCUMENTS

EP 2083038 A1 7/2009
JP 2002234990 A 8/2002
JP 2005298616 A 10/2005
JP 2008222741 A * 9/2008
JP 2009275206 A 11/2009
JP 2011219576 A 11/2011
JP 2012241180 A 12/2012
JP 2014052493 A 3/2014
JP 2018133450 A 8/2018
JP 2020037702 A 3/2020
JP 2020072264 A 5/2020
TW 201934695 A 9/2019
TW 202100685 A 1/2021

OTHER PUBLICATIONS

JP 2005298616 A English Machine Translation (Year: 2025).*
JP 2008222741 A English Machine Translation (Year: 2025).*
Japan Patent Office, Office Action Issued in Application No. 2021132268, Mar. 11, 2025, 45 pages.
Taiwan Intellectual Property Office, Office Action and Search Report Issued in Application No. 111128118, Oct. 16, 2025, 8 pages.

* cited by examiner

*Primary Examiner* — Randy P Gulakowski
*Assistant Examiner* — Holley Grace Hester
(74) *Attorney, Agent, or Firm* — Alleman Hall LLP

(57) ABSTRACT

Provided are a resin composition for sealing an optical semiconductor providing both UV transmission and heat resistance, and a molded resin product for sealing an optical semiconductor, an optical semiconductor-sealing material, and an optical semiconductor device each including the same. The resin composition satisfies the relationship $X=(A1\times A2)/A3+(B1\times B2)/B3+ \ldots <0.0005$ wherein A1 represents the mass ratio of an aromatic compound, A2 represents the number of aromatic rings per molecule of the aromatic compound, A3 represents the molecular weight of the aromatic compound, and A, B, . . . each represent an aromatic compound. The composition contains an epoxy, an alicyclic acid anhydride, and an antioxidant. When formed into a cured product (size: 50 mm in width×50 mm in length×1 mm in thickness), a linear transmittance at 300 nm is 80% or higher and a linear transmittance at 400 nm is 95% or higher.

12 Claims, No Drawings

RESIN COMPOSITION FOR SEALING OPTICAL SEMICONDUCTOR, RESIN MOLDED PRODUCT FOR SEALING OPTICAL SEMICONDUCTOR, OPTICAL SEMICONDUCTOR SEALING MATERIAL, AND OPTICAL SEMICONDUCTOR DEVICE

TECHNICAL FIELD

The present disclosure relates to resin compositions for sealing optical semiconductors, molded resin products for sealing optical semiconductors, optical semiconductor sealing materials, and optical semiconductor devices.

BACKGROUND ART

Optical semiconductor elements are formed into devices by sealing them in ceramic packages or plastic packages. Here, since ceramic packages are formed of relatively expensive materials and are inferior in mass productivity, the use of plastic packages has become mainstream. In particular, from the standpoints of workability, mass productivity, and reliability, the mainstream approach is to transfer mold an epoxy resin composition which has been previously tableted.

Optical semiconductors are used in a wide range of wavelengths from ultraviolet (UV) to infrared (IR) regions depending on the application. The light transmittance or light resistance required for optical semiconductor sealing resins depends on the wavelength used.

For example, Patent Literature 1 discloses that a specific silicone resin may be incorporated to provide good light resistance even to light of short wavelengths (e.g., 350 to 500 nm).

CITATION LIST

Patent Literature

Patent Literature 1: JP2012-241180A

SUMMARY OF INVENTION

Technical Problem

The present inventor has made extensive studies and found that the technique disclosed in Patent Literature 1 still has room for improvement in terms of UV transmission. The present inventor has made further extensive studies in this regard and found that, when an organic material is used particularly in a resin for sealing an optical semiconductor in a shorter wavelength region (e.g., UV-B at 280 to 315 nm), the light-emitting ability of light emitting diodes (LEDs) may be impaired due to optical absorption by the resin for sealing an optical semiconductor, leaving room for improvement in terms of UV transmission.

Moreover, it was newly found that although it is necessary to remove raw materials that have an aromatic ring and show optical absorption in the UV region (aromatic ring-containing materials), such as antioxidants, in order to ensure UV transmission, this raises a problem in that it is difficult to provide high functionality such as heat resistance.

The present disclosure solves the problem newly found by the present inventor and aims to provide a resin composition for sealing an optical semiconductor which provides both UV transmission and heat resistance, and a molded resin product for sealing an optical semiconductor, an optical semiconductor sealing material, and an optical semiconductor device each of which includes the resin composition.

Solution to Problem

The present disclosure relates to a resin composition for sealing an optical semiconductor, the resin composition satisfying the following relationship 1:

$$(A1\times A2)/A3+(B1\times B2)/B3+\ldots<0.0005 \quad (1)$$

wherein A1 represents a mass ratio of an aromatic compound, A2 represents a number of aromatic rings per molecule of the aromatic compound, and A3 represents a molecular weight of the aromatic compound; A, B, . . . each represent an aromatic compound, wherein the resin composition contains an epoxy, an alicyclic acid anhydride, and an antioxidant, and wherein the resin composition has a linear transmittance at a wavelength of 300 nm of 80% or higher and a linear transmittance at a wavelength of 400 nm of 95% or higher when formed into a cured product (by being heated and molded at 150° C. for four minutes and then heated at 150° C. for three hours, the cured product having a size of 50 mm in width, 50 mm in length, and 1 mm in thickness.

The epoxy is preferably a compound having a non-aromatic ring structure.

The resin composition for sealing an optical semiconductor preferably contains a release agent.

Preferably, the release agent includes a molecular structure having a structural unit represented by the following structural formula 2 and a structural unit represented by the following structural formula 3:

$$-\!\!(CH_2CH_2)_m\!\!- \quad (2)$$

wherein m is a positive number of 8 to 100;

$$-\!\!(CH_2CH_2O)_n\!\!- \quad (3)$$

wherein n is a positive number; and wherein the structural unit of structural formula 3 is set to account for 25 to 95% by mass of the molecular structure as a whole constituting the release agent.

The antioxidant is preferably a compound having a phosphite structure.

The resin composition for sealing an optical semiconductor is preferably for use in a light-emitting diode, more preferably a UV-B light-emitting diode.

The present disclosure also relates to a molded resin product for sealing an optical semiconductor, the molded resin product containing the resin composition for sealing an optical semiconductor.

The present disclosure also relates to an optical semiconductor sealing material, obtained by molding the molded resin product for sealing an optical semiconductor.

The present disclosure also relates to an optical semiconductor device, including: an optical semiconductor element; and the optical semiconductor sealing material sealing the optical semiconductor element.

In the optical semiconductor device, the optical semiconductor element is preferably a light-emitting diode, more preferably a UV-B light-emitting diode.

Advantageous Effects of Invention

The resin composition for sealing an optical semiconductor of the present disclosure satisfies relationship 1, contains an epoxy, an alicyclic acid anhydride, and an antioxidant, and has, when formed into a cured product (size: 50 mm in width×50 mm in length×1 mm in thickness) by the above-defined method, a linear transmittance at a wavelength of 300 nm of 80% or higher and a linear transmittance at a wavelength of 400 nm of 95% or higher. This provides both UV transmission and heat resistance.

DESCRIPTION OF EMBODIMENTS

A resin composition for sealing an optical semiconductor of the present disclosure satisfies the following relationship 1:

$$X=(A1\times A2)/A3+(B1\times B2)/B3+\ldots<0.0005 \quad (1)$$

wherein A1 represents a mass ratio of an aromatic compound, A2 represents a number of aromatic rings per molecule of the aromatic compound, and A3 represents a molecular weight of the aromatic compound; and A, B, . . . each represent an aromatic compound. Further, the resin composition contains an epoxy, an alicyclic acid anhydride, and an antioxidant. Further, the resin composition has a linear transmittance at a wavelength of 300 nm of 80% or higher and a linear transmittance at a wavelength of 400 nm of 95% or higher when formed into a cured product (size: 50 mm in width×50 mm in length×1 mm in thickness) by being heated and molded at 150° C. for four minutes and then heated at 150° C. for three hours.

This provides both ultraviolet (UV) transmission and heat resistance.

The reason why the composition provides such an advantageous effect is believed to be as follows.

X in relationship 1 represents the number (pcs/g) of aromatic rings per gram of the resin composition for sealing an optical semiconductor. Satisfying relationship 1 means that the number of aromatic rings in the composition is small. Further, since the composition has a linear transmittance at a wavelength of 300 nm of 80% or higher and a linear transmittance at a wavelength of 400 nm of 95% or higher when formed into a cured product by the above-defined method, it provides good UV transmission.

Moreover, since the composition contains an epoxy, an alicyclic acid anhydride, and an antioxidant while satisfying the above requirements, it provides good heat resistance as well as good UV transmission.

Thus, since the composition satisfies relationship 1 while containing an epoxy, an alicyclic acid anhydride, and an antioxidant, and has a linear transmittance at a wavelength of 300 nm of 80% or higher and a linear transmittance at a wavelength of 400 nm of 95% or higher when formed into a cured product by the above-defined method, it provides both UV transmission and heat resistance.

<Resin Composition for Sealing Optical Semiconductor>

The resin composition for sealing an optical semiconductor of the present disclosure satisfies the following relationship 1:

$$X=(A1\times A2)/A3+(B1\times B2)/B3+\ldots<0.0005 \quad (1)$$

wherein A1 represents the mass ratio of an aromatic compound, A2 represents the number of aromatic rings per molecule of the aromatic compound, and A3 represents the molecular weight of the aromatic compound; and A, B, . . . each represent an aromatic compound.

A1 represents the mass ratio of an aromatic compound, namely, the mass ratio of an aromatic compound A in the composition. For example, when 1 part by mass of the aromatic compound A is contained in 100 parts by mass of the composition, A1 is 1/100=0.01.

A2 represents the number of aromatic rings per molecule of the aromatic compound, namely, the number of aromatic rings per molecule of the aromatic compound A.

A3 represents the molecular weight of the aromatic compound, namely, the molecular weight of the aromatic compound A.

A, B, . . . each represent an aromatic compound. (A1×A2)/A3 is calculated for each type of aromatic compound, and the calculation results of all aromatic compounds are summed up to calculate X.

X is less than 0.0005, and preferably 0.0004 or less. The lower limit is not limited as a smaller X is more preferred.

The resin composition for sealing an optical semiconductor of the present disclosure has a linear transmittance at a wavelength of 300 nm of 80% or higher and a linear transmittance at a wavelength of 400 nm of 95% or higher when formed into a cured product by the above-defined method.

In the preparation of such a composition, the composition may be prepared according to the following guidelines.

(1) Compounds containing few aromatic rings are used. This is because aromatic rings have high optical absorption at 250 to 320 nm.

(2) Even when compounds containing aromatic rings are used, those having no conjugated structure are used. The reason for this is that compounds containing aromatic rings and having conjugated structures have high optical absorption at 280 to 320 nm, while compounds containing aromatic rings but having no conjugated structure have almost no optical absorption over 280 to 400 nm.

(3) Compounds containing cyclohexane are used. This is because compounds containing cyclohexane have almost no optical absorption over 280 to 400 nm.

The resin composition for sealing an optical semiconductor of the present disclosure contains an epoxy (epoxy resin), an alicyclic acid anhydride, and an antioxidant.

<<Thermosetting Resin>>

The epoxy resin is preferably one that is less colored. Examples include bisphenol A epoxy resins, bisphenol F epoxy resins, phenol novolac epoxy resins, alicyclic epoxy resins, triglycidyl isocyanurate, hydantoin epoxies, and other heterocyclic ring-containing epoxy resins; hydrogenated bisphenol A epoxy resins, aliphatic epoxy resins, glycidyl ether epoxy resins, and cresol novolac epoxy resins. These may be used alone or in combinations of two or more. In particular, the epoxy resin is preferably a compound (epoxy resin) having a non-aromatic ring structure, more preferably a compound containing no aromatic ring. This is because when an aromatic ring-containing epoxy resin such as a bisphenol A epoxy resin is used, it is difficult for the resin composition to satisfy relationship 1 and further have a linear transmittance at a wavelength of 300 nm of 80% or higher and a linear transmittance at a wavelength of 400 nm of 95% or higher when formed into a cured product by the above-defined method, possibly resulting in poor UV transmission. In contrast, when the epoxy resin used is a compound having a non-aromatic ring structure, it is easier for the resin composition to satisfy relationship 1 and further have a linear transmittance at a wavelength of 300 nm of 80% or higher and a linear transmittance at a wavelength of 400 nm of 95% or higher when formed into a cured product by the above-defined method, resulting in higher UV transmission. Further, the resin composition provides better heat resistance.

The non-aromatic ring structure may be any saturated or unsaturated ring structure (preferably having no unsaturated bond in the ring) having no aromaticity, and may be, for example, a non-aromatic heterocyclic structure or an alicyclic structure. Preferred among these is a non-aromatic heterocyclic structure.

The term "non-aromatic heterocyclic structure" as used herein refers to a saturated or unsaturated ring structure (preferably having no unsaturated bond in the ring) having no aromaticity which consists of an atom other than a carbon atom and a carbon atom. The term "alicyclic structure" as used herein refers to a saturated or unsaturated carbocyclic structure (preferably having no unsaturated bond in the ring) having no aromaticity.

The number of ring members in the non-aromatic ring is not limited, but is preferably 3 or more, more preferably 4 or more, still more preferably 5 or more, and is preferably 13 or less, more preferably 10 or less, still more preferably 7 or less. When the number of ring members is within the range indicated above, both UV transmission and heat resistance tend to be better provided.

The non-aromatic ring may be a monocyclic ring or a polycyclic ring, or may have a bridge structure. Preferred among these is a monocyclic ring.

The atom other than a carbon atom contained in the ring structure of the non-aromatic heterocyclic ring is not limited, and examples include an oxygen atom, a nitrogen atom, a sulfur atom, a boron atom, a silicon atom, and a phosphorus atom. These may be used alone or in combinations of two or more. Preferred among these are an oxygen atom, a nitrogen atom, and a sulfur atom, with an oxygen atom and a nitrogen atom being more preferred, with a nitrogen atom being still more preferred.

The number of atoms other than a carbon atom contained in the ring structure of the non-aromatic heterocyclic ring is not limited, but is preferably one or more, more preferable two or more, and is preferably five or less, more preferably four or less. When the number of atoms other than a carbon atom is within the range indicated above, both UV transmission and heat resistance tend to be better provided.

The compound having a non-aromatic ring structure may be any compound having a non-aromatic ring structure and may have a plurality of non-aromatic ring structures in the molecule. The compound having a non-aromatic ring structure preferably contains no aromatic ring.

Non-limiting examples of the compound (epoxy resin) having a non-aromatic ring structure include hydrogenated bisphenol A epoxy resins, hydrogenated bisphenol F epoxy resins, hydrogenated phenol novolac epoxy resins, hydrogenated cresol novolac epoxy resins, alicyclic epoxy resins, triglycidyl isocyanurate, hydantoin epoxies, 3,4-epoxycyclohexane carboxylate, and an adduct of 1,2-epoxy-4-(2-oxiranyl)cyclohexane with 2,2-bis(hydroxymethyl)-1-butanol. These may be used alone or in combinations of two or more. Preferred among these are triglycidyl isocyanurate, 3,4-epoxycyclohexane carboxylate, and an adduct of 1,2-epoxy-4-(2-oxiranyl)cyclohexane with 2,2-bis(hydroxymethyl)-1-butanol, with triglycidyl isocyanurate being more preferred.

The percentage of epoxy resins having a non-aromatic ring structure (preferably triglycidyl isocyanurate) based on 100% by mass of the total epoxy resins is preferably 40% by mass or more, more preferably 60% by mass or more, still more preferably 80% by mass or more, particularly preferably 90% by mass or more, most preferably 95% by mass or more, and may be 100% by mass. When the percentage is within the range indicated above, both UV transmission and heat resistance tend to be better provided.

The resin composition for sealing an optical semiconductor of the present disclosure may contain a thermosetting resin other than epoxy resins.

The percentage of epoxy resins based on 100% by mass of the total thermosetting resins is preferably 10% by mass or more, more preferably 20% by mass or more, still more preferably 30% by mass or more, particularly preferably 60% by mass or more, most preferably 80% by mass or more, further most preferably 90% by mass or more, and may be 100% by mass. When the percentage is within the range indicated above, both UV transmission and heat resistance tend to be better provided.

<<Curing Agent>>

The resin composition for sealing an optical semiconductor of the present disclosure contains an alicyclic acid anhydride as a curing agent. When an alicyclic acid anhydride is present as a curing agent, it is easier for the resin composition to satisfy relationship 1 and further have a linear transmittance at a wavelength of 300 nm of 80% or higher and a linear transmittance at a wavelength of 400 nm of 95% or higher when formed into a cured product by the above-defined method, resulting in higher UV transmission. Further, the resin composition provides better heat resistance.

The term "alicyclic acid anhydride" as used herein refers to a compound having an anhydride group (preferably a carboxylic anhydride group) and an alicyclic structure.

A single curing agent may be used, or two or more curing agents may be used in combination.

Examples of the alicyclic acid anhydride include alicyclic polycarboxylic acid anhydrides such as hexahydrophthalic anhydride, tetrahydrophthalic anhydride, methylnadic anhydride, nadic anhydride, methylhexahydrophthalic anhydride, methyltetrahydrophthalic anhydride, dimethyltetrahydrophthalic anhydride, norbornene dicarboxylic anhydride, methylbicyclo[2.2.1]heptane-2,3-dicarboxylic anhydride, bicyclo[2.2.1]heptane-2,3-dicarboxylic anhydride, bicyclo[2.2.1]hept-5-ene-2,3-dicarboxylic anhydride, methylbicyclo[2.2.1]hept-5-ene-2,3-dicarboxylic anhydride, and cyclopentane tetracarboxylic anhydride. These may be used alone or in combinations of two or more. Preferred among these are hexahydrophthalic anhydride and methylhexahydrophthalic anhydride, with hexahydrophthalic anhydride being more preferred.

The amount of alicyclic acid anhydrides per 100 parts by mass of the total epoxy resins is preferably 20 to 200 parts by mass, more preferably 60 to 180 parts by mass. The lower limit is more preferably 100 parts by mass or more. When the amount is less than 20 parts by mass, the curing rate is reduced, while when the amount is more than 200 parts by mass, they are present in an excessive amount in the curing reaction, possibly causing deterioration in physical properties.

The resin composition for sealing an optical semiconductor of the present disclosure may contain a curing agent other than alicyclic acid anhydrides.

Examples of the curing agent other than alicyclic acid anhydrides include acid anhydride curing agents other than alicyclic acid anhydrides, such as acyclic polycarboxylic acid anhydrides and aromatic polycarboxylic acid anhydrides, phenolic curing agents, and amine curing agents. These may also be used alone or in combinations of two or more.

The percentage of alicyclic acid anhydrides based on 100% by mass of the total curing agents is preferably 60% by mass or more, more preferably 80% by mass or more, still more preferably 90% by mass or more, and may be 100% by mass. When the percentage is within the range indicated above, both UV transmission and heat resistance tend to be better provided.

<<Antioxidant>>

The resin composition for sealing an optical semiconductor of the present disclosure contains an antioxidant. This provides good heat resistance.

A single antioxidant may be used, or two or more antioxidants may be used in combination.

Antioxidants include primary antioxidants which can capture radicals generated when bonds are broken, and secondary antioxidants which can break down oxides. It is preferred to combine both antioxidants. This provides better heat resistance.

Examples of the primary antioxidants include hindered phenol compounds. These may be used alone or in combinations of two or more. Preferred among the primary antioxidants are hindered phenol compounds because they provide good heat resistance.

Examples of the hindered phenol compounds include 2,6-di-tert-butyl-p-cresol, pentaerythrityl-tetrakis[3-(3,5-di-tert-butyl-4-hydroxyphenyl)propionate], N,N'-hexamethylenebis(3,5-di-tert-butyl-4-hydroxy-hydrocinnamide), 1,3,5-trimethyl-2,4,6-tris(3,5-di-tert-butyl-4-hydroxybenzyl) benzene, and tris(3,5-di-tert-butyl-4-hydroxybenzyl) isocyanurate. These may be used alone or in combinations of two or more. Preferred among these are 2,6-di-tert-butyl-p-cresol and pentaerythrityl-tetrakis[3-(3,5-di-tert-butyl-4-hydroxyphenyl)propionate], with 2,6-di-tert-butyl-p-cresol being more preferred, because they provide good heat resistance.

The amount of primary antioxidants per 100 parts by mass of the total epoxy resins is preferably 0.5 to 20 parts by mass, more preferably 0.5 to 15 parts by mass, still more preferably 0.5 to 5 parts by mass, particularly preferably 0.5 to 3 parts by mass.

When the amount is less than 0.5 parts by mass, heat resistance may be lowered, while when the amount is more than 20 parts by mass, UV transmission may be lowered.

Examples of the secondary antioxidants include compounds having a phosphite structure and sulfur compounds. These may be used alone or in combinations of two or more. Preferred among these are compounds having a phosphite structure (phosphite compounds) because they provide good heat resistance and good UV transmission.

Commonly used antioxidants have an aromatic ring and a conjugated structure and therefore have high optical absorption at 280 to 320 nm. In contrast, phosphite compounds have an aromatic ring but no conjugated structure and therefore have almost no optical absorption over 280 to 400 nm. Thus, the incorporation of a phosphite compound provides good heat resistance and makes it easier for the resin composition to have a linear transmittance at a wavelength of 300 nm of 80% or higher and a linear transmittance at a wavelength of 400 nm of 95% or higher when formed into a cured product by the above-defined method, resulting in higher UV transmission.

Examples of the phosphite compounds include triphenyl phosphite, tris(nonylphenyl)phosphite, tricresyl phosphite, triethyl phosphite, tris(2-ethylhexyl phosphite), tridecyl phosphite, trilauryl phosphite, tris(tridecyl) phosphite, trioleyl phosphite, diphenyl mono(2-ethylhexyl)phosphite, diphenyl monodecyl phosphite, diphenyl mono(tridecyl) phosphite, trilauryl thiophosphite, bis(decyl)pentaerythritol diphosphite, tristearyl phosphite, distearyl pentaerythritol diphosphite, and tris(2,4-di-tert-butylphenyl)phosphite. These may be used alone or in combinations of two or more. Preferred among these is triphenyl phosphite because it provides good heat resistance and good UV transmission.

The amount of secondary antioxidants per 100 parts by mass of the total epoxy resins is preferably 0.5 to 17 parts by mass, more preferably 0.5 to 13 parts by mass, still more preferably 1 to 10 parts by mass.

When the amount is less than 0.5 parts by mass, heat resistance may be lowered, while when the amount is more than 17 parts by mass, UV transmission may be lowered.

<<Polyhydric Alcohol>>

The resin composition for sealing an optical semiconductor of the present disclosure preferably contains a polyhydric alcohol. This can control the glass transition temperature, so that both UV transmission and heat resistance tend to be better provided.

A single polyhydric alcohol may be used, or two or more polyhydric alcohols may be used in combination.

The polyhydric alcohol used may be any compound having two or more hydroxy groups, preferably a diol (glycol).

Examples of the polyhydric alcohol include diols preferably having 2 to 10, more preferably 2 to 6, still more preferably 2 to 5 carbon atoms. Examples of the diols include ethylene glycol, propylene glycol, neopentyl glycol, pentanediol, and butanediol. Preferred among these is neopentyl glycol.

Other examples of the polyhydric alcohol include polyalkylene glycols such as polyethylene glycol and polypropylene glycol. Preferred among these is polyethylene glycol.

Also preferred are combinations of diols having the number of carbon atoms indicated above and polyalkylene glycols.

The amount of polyhydric alcohols per 100 parts by mass of the total epoxy resins is preferably 10 to 60 parts by mass, more preferably 10 to 50 parts by mass, still more preferably 10 to 40 parts by mass. When the amount is within the range indicated above, both UV transmission and heat resistance tend to be better provided. The lower the amount of polyhydric alcohols, the higher the Tg, and the better the heat resistance tends to be.

<<Release Agent>>

The resin composition for sealing an optical semiconductor of the present disclosure preferably contains a release agent. This improves moldability, so that both UV transmission and heat resistance tend to be better provided.

A single release agent may be used, or two or more release agents may be used in combination.

Examples of the release agent include ether bond-containing release agents, fluorine release agents, and silicone release agents. These may be used alone or in combinations of two or more. Among these, ether bond-containing release agents are preferred in terms of compatibility.

Preferred among the ether bond-containing release agents are, for example, release agents (block polymers) including a molecular structure having a structural unit represented by the structural formula 2 below and a structural unit represented by the structural formula 3 below, more preferably wherein the structural unit of structural formula 3 is set to account for 25 to 95% by mass of the molecular structure as a whole constituting the release agent. Here, the bond at each end of the structural units of formulas 2 and 3 is bound to a hydrogen atom.

$$-\!\!\left(CH_2CH_2\right)_m\!\!- \qquad (2)$$

In formula 2, m is a positive number of 8 to 100.

$$-\!\!\left(CH_2CH_2O\right)_n\!\!- \qquad (3)$$

In formula 3, n is a positive number.

The number of repetitions m in the structural unit of structural formula 2 is a positive number of 8 to 100 and the structural unit of structural formula 3 is set to account for 25 to 95% by mass of the molecular structure as a whole constituting the release agent. More preferably, the number of repetitions m in the structural unit of structural formula 2 is a positive number of 13 to 60 and the structural unit of structural formula 3 accounts for 35 to 85% by mass of the molecular structure as a whole constituting the release agent. Particularly preferably, the number of repetitions m in the structural unit of structural formula 2 is a positive number of 17 to 40 and the structural unit of structural formula 3 accounts for 40 to 70% by mass of the molecular structure as a whole constituting the release agent. Moreover, the structural unit of structural formula 2 and the structural unit of structural formula 3 may be present continuously or discontinuously (e.g., at random) in the molecular structure. Although they may be present in any form, preferred is a form where they are present continuously, so-called "block-wise". Moreover, not only one but also a plurality of structural units of structural formula 2 or structural units of structural formula 3 may be present in the molecular structure.

In addition to the structural unit of structural formula 2 and the structural unit of structural formula 3, the units constituting the release agent may include an alkyl group, an alkylene group, a carboxy group, an ester bond, a ketone bond, a benzene ring, a hydrogen atom, a metal atom, etc. However, in the specific release agents, the structural unit of structural formula 2 and the structural unit of structural formula 3 usually preferably account for 70 to 99% by mass of the molecular structure as a whole.

The number average molecular weight of the release agents is usually preferably 300 to 12,000, more preferably 600 to 5,000, particularly preferably 900 to 2,500. Here, the number average molecular weight is determined by gel permeation chromatography (GPC) relative to polystyrene standards. Moreover, the molecular structure of the release agents may be identified as follows. Specifically, the spectral integral ratio of the hydrogen atoms bound to a carbon atom having an adjacent oxygen atom [—($CH_2CH_2O$)—] and the hydrogen atoms bound to carbon atoms and sandwiched between carbon atoms [—($CH_2CH_2$)—] is determined by $^1$H-NMR and used to determine the proportions of the structural units. Then, the numbers of repetitions thereof are calculated from the molecular weight value. Thus, the molecular structure can be identified.

The amount of release agents per 100 parts by mass of the total epoxy resins is preferably 0.5 to 20 parts by mass, more preferably 5 to 20 parts by mass, still more preferably 5 to 15 parts by mass. When the amount is within the range indicated above, both UV transmission and heat resistance tend to be better provided.

<<Curing Accelerator>>

The resin composition for sealing an optical semiconductor of the present disclosure preferably contains a curing accelerator. In this case, both UV transmission and heat resistance tend to be better provided.

A single curing accelerator may be used, or two or more curing accelerators may be used in combination.

Examples of the curing accelerator include tertiary amines such as triethanolamine; imidazoles such as 2-methylimidazole, 2-ethyl-4-methylimidazole, and 2-methyl-4-methylimidazole; organophosphorus compounds such as tributyl (methyl)phosphonium dimethylphosphate, tetraphenylphosphonium tetraphenylborate, and triphenylphosphine; and diazabicycloalkene compounds such as 1,8-diazabicyclo[5.4.0]undecene-7 and 1,5-diazabicyclo [4.3.0]nonene-5. These may be used alone or in combinations of two or more. Preferred among these are compounds containing no aromatic ring, with organophosphorus compounds being more preferred, with tributyl(methyl)phosphonium dimethylphosphate being still more preferred.

The amount of curing accelerators per 100 parts by mass of the total epoxy resins is not limited, and may be selected as appropriate, for example, from a range of 0.1 to 5 parts by mass. The amount is preferably 0.5 to 3 parts by mass, more preferably 1 to 2 parts by mass. When the amount of curing accelerators is too small, the curing rate may be reduced, lowering productivity, while when the amount of curing accelerators is too large, the curing rate may be so fast that the control of the reaction state may become difficult, possibly resulting in variations in reaction.

<<Other Additives>>

The resin composition for sealing an optical semiconductor of the present disclosure may optionally contain, in addition to the above components, additives such as lubricants, phosphors for changing the wavelength of light, and inorganic/organic fillers for diffusing light. These additives may be used alone or in combinations of two or more.

Examples of the lubricants include waxes such as stearic acid, magnesium stearate, and calcium stearate, and talc. Here, when one or more lubricants are incorporated, the amount thereof may be determined as appropriate according to the tableting conditions. For example, the amount is suitably set to 0.1 to 0.4% by mass of the total resin composition.

Examples of the phosphors for changing the wavelength of light and inorganic/organic fillers for diffusing light include quartz glass powder, talc, silica powders such as fused silica powder and crystalline silica powder, alumina, silicon nitride, aluminum nitride, and silicon carbide. These may be used alone or in combinations of two or more. Here, when one or more phosphors and/or inorganic/organic fillers are incorporated, the amount thereof may be determined as appropriate according to the molding conditions. Specifically, in the case of phosphors, the amount of phosphors may be selected as appropriate from a range of 1 to 60% by mass of the total resin composition. On the other hand, in the case of (organic/inorganic) fillers for scattering light, the amount of fillers for scattering light may be selected as appropriate from a range of 0.5 to 25% by mass of the total molded resin product.

<<Reaction Product>>

The resin composition for sealing an optical semiconductor of the present disclosure may contain a reaction product of compounding agents, such as a reaction product between a thermosetting resin and a curing agent.

<Method for Preparation of Resin Composition for Sealing Optical Semiconductor>

The resin composition for sealing an optical semiconductor of the present disclosure may be prepared by any method that can knead and disperse the components. Preferably, it may be heat-treated into a B-stage (semi-cured) form.

For example, a method for preparing the resin composition for sealing an optical semiconductor of the present disclosure includes:

kneading a thermosetting resin, a curing agent, and a curing accelerator to obtain a curable resin composition; and heat-treating the curable resin composition.

The kneading may be performed by any method such as using an extruder. The kneading may also be performed at any temperature, and the kneading temperature may be changed as appropriate according to the characteristics of the thermosetting resin and may be set high to allow the reaction to proceed during kneading. Specifically, the kneading temperature is preferably 80 to 150° C., more preferably 110 to 130° C.

The curable resin composition obtained by kneading may have any shape such as a film, a sheet, granules, or a bulk.

Although the curable resin composition obtained by kneading may have any thickness, the thickness is preferably 1 to 30 mm, more preferably 2 to 20 mm, still more preferably 2 to 10 mm. When the thickness is less than 1 mm, such a thin composition is susceptible to moisture absorption. When the thickness is more than 30 mm, cooling the composition takes time, so that the reaction tends to vary due to internal heat accumulation.

The curable resin composition obtained by kneading may be heat-treated to obtain a B-stage (semi-cured) resin composition for sealing an optical semiconductor. Although the heat treatment may be performed at any temperature, the heat treatment temperature is preferably 25 to 100° C., more preferably 60 to 80° C. When the heat treatment temperature is lower than 25° C., the curing reaction may be so slow that productivity tends to decrease. When the heat treatment temperature is higher than 100° C., the curing reaction may be so fast that it tends to be difficult to terminate the reaction in a predetermined state. The heat treatment time is not limited, and it may be changed as appropriate according to the characteristics of the thermosetting resin.

The B-stage (semi-cured) resin composition for sealing an optical semiconductor obtained by heat treatment is preferably subjected to milling and/or granulating to obtain a granular curable resin composition.

In the case of milling, the heat-treated resin composition is milled to obtain a granular resin composition. The milling may be performed using a ball mill, a turbo mill, or other device.

In the case of granulation, the heat-treated resin composition is granulated to obtain a granular resin composition. Prior to the granulation, the resin composition may be milled using a ball mill, a turbo mill, or other device. The granulation may be performed by any method such as using a dry compression granulator.

Although the granules obtained by milling and/or granulation may have any average particle size, the average particle size is preferably 1 to 5000 μm, more preferably 100 to 2000 μm. When the average particle size is larger than 5000 μm, the compression ratio tends to be lowered.

The step of obtaining a granular curable resin composition preferably includes granulating the heat-treated curable resin composition (B-stage (semi-cured) resin composition for sealing an optical semiconductor) to obtain a granular curable resin composition.

The resin composition for sealing an optical semiconductor of the present disclosure prepared as described above or by other methods has a linear transmittance at a wavelength of 300 nm of 80% or higher and a linear transmittance at a wavelength of 400 nm of 95% or higher when formed into a cured product (size: 50 mm in width×50 mm in length×1 mm in thickness) by the following preparation method:

the resin composition is heated and molded at 150° C. for four minutes and then heated at 150° C. for three hours to obtain the cured product.

The linear transmittance at a wavelength of 300 nm is 80% or higher, preferably 81% or higher, more preferably 83% or higher, still more preferably 85% or higher, and the upper limit is not limited. In this case, the cured product can suitably transmit light at a wavelength of around 300 nm, thereby improving the luminous efficacy of the light-emitting element.

The linear transmittance at a wavelength of 400 nm is 95% or higher, preferably 96% or higher, more preferably 97% or higher, still more preferably 98% or higher, and the upper limit is not limited. In this case, the cured product can suitably transmit light at a wavelength of around 400 nm, thereby improving the luminous efficacy of the light-emitting element.

The linear transmittances are determined by measuring a transmission spectrum of the cured product at a wavelength of 300 nm or 400 nm using a spectrophotometer. Here, the measurement of a transmission spectrum is performed in a direction perpendicular to the bottom surface (or top surface) of the sample.

<Molded Resin Product for Sealing Optical Semiconductor>

The molded resin product for sealing an optical semiconductor of the present disclosure may be a tablet, a sheet, or other form. The molded resin product may be molded so as to cover the optical semiconductor element constituting an optical semiconductor device, thereby sealing the element.

When the molded resin product for sealing an optical semiconductor is a tablet, the volume thereof is not limited, but it is preferably 1 to 100 $cm^3$, more preferably 10 to 100 $cm^3$.

For example, a method for preparing the molded resin product for sealing an optical semiconductor of the present disclosure includes, in addition to the above step, molding the granular resin composition obtained by the step of obtaining a granular curable resin composition.

The resin composition for sealing an optical semiconductor of the present disclosure is molded to obtain the molded resin product for sealing an optical semiconductor of the present disclosure. Thus, the molded resin product for sealing an optical semiconductor which contains the resin composition for sealing an optical semiconductor is obtained. The molded product may be a tablet or a sheet. The molding may be performed by tableting for obtaining tablets, extrusion for obtaining a sheet, or other methods. The thus molded product is of high quality providing both UV transmission and heat resistance.

As the resin composition for sealing an optical semiconductor is molded to obtain the molded resin product for sealing an optical semiconductor, the resin composition for sealing an optical semiconductor and the molded resin product for sealing an optical semiconductor are almost the same in composition.

When the molded product is a tablet, the conditions for tableting may be adjusted as appropriate according to the composition of the resin composition for sealing an optical semiconductor or other factors. In general, the compression ratio for the tableting is suitably set to 90 to 96%. Specifically, this is because when the compression ratio is lower than 90%, the resulting tablet may have lower density and easily break, while when the compression ratio is higher than 96%, cracks may be formed upon tableting, causing chipping or breakage upon removal from the mold.

<Optical Semiconductor Sealing Material, Optical Semiconductor Device>

The molded resin product for sealing an optical semiconductor of the present disclosure may seal an optical semiconductor element by a molding method such as transfer molding to prepare an optical semiconductor device. In other words, the molded resin product for sealing an optical semiconductor of the present disclosure may form an optical semiconductor sealing material for sealing an optical semiconductor element with a resin by molding such as transfer molding. Thus, the optical semiconductor sealing material of the present disclosure can be obtained by molding the molded resin product for sealing an optical semiconductor of the present disclosure.

The term "optical semiconductor sealing material" as used herein refers to a member that is formed so as to cover the optical semiconductor element constituting an optical semiconductor device, thereby sealing the element.

Since the resin composition for sealing an optical semiconductor and the molded resin product for sealing an optical semiconductor of the present disclosure make it possible to provide both UV transmission and heat resistance, the optical semiconductor sealing material obtained by molding the resin composition for sealing an optical semiconductor or the molded resin product for sealing an optical semiconductor of the present disclosure is a high quality optical semiconductor sealing material capable of providing both UV transmission and heat resistance.

The optical semiconductor device of the present disclosure includes an optical semiconductor element and the optical semiconductor sealing material of the present disclosure sealing the optical semiconductor element. The optical semiconductor device of the present disclosure including the optical semiconductor sealing material of the present disclosure is a high quality optical semiconductor device capable of providing both UV transmission and heat resistance.

The resin composition for sealing an optical semiconductor and the molded resin product for sealing an optical semiconductor of the present disclosure each have a linear transmittance at a wavelength of 300 nm of 80% or higher and a linear transmittance at a wavelength of 400 nm of 95% or higher when formed into a cured product, and therefore have excellent visible light transmission and excellent UV transmission.

Thus, the resin composition for sealing an optical semiconductor and the molded resin product for sealing an optical semiconductor of the present disclosure each can be suitably used as a sealing material for an light-emitting element or a sealing material for a light-emitting device including a light-emitting element, more suitably as a sealing material for a light-emitting diode or a sealing material for a light-emitting device including a light-emitting diode.

Likewise, the optical semiconductor device of the present disclosure is preferably a light-emitting device including a light-emitting element, more preferably a light-emitting device including a light-emitting diode.

The light-emitting element may be, for example, a UV light-emitting element such as a UV-A (315 to 400 nm) light-emitting element, a UV-B (280 to 315 nm) light-emitting element, or a UV-C (100 to 280 nm) light-emitting element, or a visible light-emitting element. Preferably, it is a UV light-emitting element, more preferably a UV-B light-emitting element or a UV-C light-emitting element, still more preferably a UV-B light-emitting element.

Moreover, the light-emitting element is preferably a light-emitting diode.

Moreover, the light-emitting diode used may be a shell type (DIP type), a chip type (surface mount type), or other type, preferably a chip type, more preferably a high intensity chip LED.

EXAMPLES

The following describes examples together with comparative examples. However, the present disclosure is not intended to be limited to the following examples.

The materials used are listed below.

Epoxy (Epoxy resin): TEPIC-S (triglycidyl isocyanurate, the compound represented by the following formula (epoxy equivalent: 100)) available from Nissan Chemical Corporation:

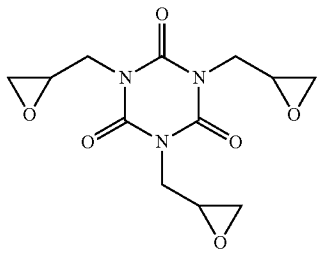 [SMILES: O=c1n(CC2CO2)c(=O)n(CC2CO2)c(=O)n1CC1CO1]

Alicyclic acid anhydride: RIKACID MH-700G (a mixture of hexahydrophthalic anhydride and 4-methylhexahydrophthalic anhydride, a mixture of the compounds represented by the following formulas) available from New Japan Chemical Co., Ltd.:

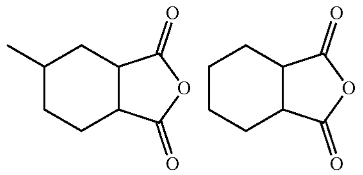

Polyhydric alcohol 1: P-700 (polyethylene glycol, the compound represented by the following formula (n=11)) available from ADEKA Corporation:

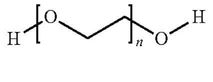

Polyhydric alcohol 2: neopentyl glycol (the compound represented by the following formula):

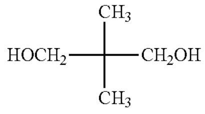

Internal release agent: the compound represented by the following formula (m=26, n=17; the numbers of repeating units here are each the average of all molecules and not all the molecules necessarily have these numbers of repeating units):

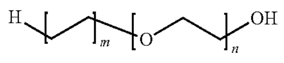

Primary antioxidant: H-BHT (2,6-di-tert-butyl-p-cresol, the compound represented by the following formula) available from Honshu Chemical Industry Co., Ltd.:

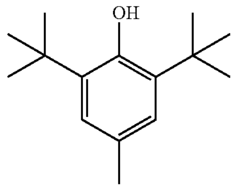 [SMILES: Cc1cc(C(C)(C)C)c(O)c(C(C)(C)C)c1]

Secondary antioxidant 1: TPP-R (triphenyl phosphite, the compound represented by the following formula) available from Daihachi Chemical Industry Co., Ltd.:

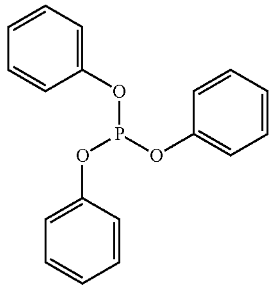 [SMILES: c1ccc(OP(Oc2ccccc2)Oc2ccccc2)cc1]

Secondary antioxidant 2: HCA (9,10-dihydro-9-oxa-10-phosphaphenanthrene-10-oxide) available from Sanko Co., Ltd.

Curing accelerator: PX-4MP (tributyl(methyl)phosphonium dimethylphosphate, the compound represented by the following formula) available from Nippon Chemical Industrial Co., Ltd.:

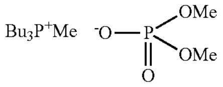

Examples and Comparative Examples

The raw materials in amounts as shown in Table 1 were heat-melted at 100 to 150° C. and mixed. The curable resin composition obtained by mixing was heat-treated to obtain a B-stage (semi-cured) resin composition for sealing an optical semiconductor. The heat melting temperature, the heat treatment temperature, and the heat treatment time were changed as appropriate according to the characteristics of the thermosetting resin.

The resin compositions for sealing an optical semiconductor obtained in the examples and comparative examples were evaluated as described below. Table 1 shows the evaluation results.

<Preparation of Test Piece (Cured Product)>

The resin compositions for sealing an optical semiconductor prepared as above were each molded in a mold (curing condition: heating at 150° C. for four minutes) to prepare a cured product (size: 50 mm in width×50 mm in length×1 mm in thickness) for a test piece. The cured product was heated at 150° C. for three hours to complete the curing. Thus, a test piece was obtained.

<Linear Transmittance>

First, a quartz cell was filled with liquid paraffin available from Fujifilm Wako Pure Chemical Corporation, and the base line was measured using a spectrophotometer V-670 available from JASCO Corporation. Then, each test piece (size: 50 mm in width×50 mm in length×1 mm in thickness) prepared above was immersed in the liquid paraffin in the quartz cell, and the light transmittance (linear transmittance) at a wavelength of 300 nm and the light transmittance (linear transmittance) at a wavelength of 400 nm were measured using a spectrophotometer (V-670 available from JASCO Corporation) at room temperature (25° C.) under conditions where light scattering on the surface of the test piece was suppressed. Here, the measurement of a transmission spectrum was performed in a direction perpendicular to the bottom surface of the sample (in the thickness direction).

<Heat Resistance Test>

Each test piece (size: 50 mm in width×50 mm in length×1 mm in thickness) prepared above was allowed to stand in a 150° C. environment for 168 hours. The test piece after standing was measured for the light transmittance (linear transmittance) at a wavelength of 400 nm in the same manner as described above. The heat resistance is considered good when the light transmittance is 80% or higher.

TABLE 1

| | | Molecular weight (g/mol) | Number of aromatic rings (pcs) | Example 1 | Example 2 | Example 3 | Example 4 |
|---|---|---|---|---|---|---|---|
| Amount (parts by mass) | Epoxy | | 0 | 100 | 100 | 100 | 100 |
| | Alicyclic acid anhydride | | 0 | 152 | 152 | 152 | 152 |
| | Polyhydric alcohol 1 | | 0 | 15 | 15 | 15 | 15 |
| | Polyhydric alcohol 2 | | 0 | 19.2 | 19.2 | 19.2 | 19.2 |
| | Internal release agent | | 0 | 10 | 10 | 10 | 10 |
| | Primary antioxidant | 220.34 | 1 | 1 | 1 | 1 | 0 |

TABLE 1-continued

| | | | | | | | |
|---|---|---|---|---|---|---|---|
| | Secondary antioxidant 1 | 310.29 | 3 | 1 | 5 | 10 | 1 |
| | Secondary antioxidant 2 | 216 | 2 | 0 | 0 | 0 | 0 |
| | Curing accelerator | | | 1.2 | 1.2 | 1.2 | 1.2 |
| | Total | | | 299.4 | 303.4 | 308.4 | 298.4 |
| Evaluation | Aromatic equivalent X | | | 0.00005 | 0.00017 | 0.00033 | 0.00003 |
| | Transmittance (300 nm, 1 mm) | | | 86.7 | 81. 9 | 80.4 | 83. 8 |
| | Transmittance (400 nm, 1 mm) | | | 98.5 | 97.7 | 97.6 | 96.4 |
| | Transmittance (400 nm, 1 mm) after 168 hours at 150° C. | | | 91.9 | 95.3 | 92.4 | 85.1 |

| | | Comparative Example 1 | Comparative Example 2 | Comparative Example 3 | Comparative Example 4 | Comparative Example 5 |
|---|---|---|---|---|---|---|
| Amount (parts by mass) | Epoxy | 100 | 100 | 100 | 100 | 100 |
| | Alicyclic acid anhydride | 152 | 152 | 152 | 152 | 152 |
| | Polyhydric alcohol 1 | 15 | 15 | 15 | 15 | 15 |
| | Polyhydric alcohol 2 | 19.2 | 19.2 | 19.2 | 19.2 | 19.2 |
| | Internal release agent | 10 | 10 | 10 | 10 | 10 |
| | Primary antioxidant | 1 | 1 | 1 | 1 | 1 |
| | Secondary antioxidant 1 | 0 | 0 | 0 | 20 | 0 |
| | Secondary antioxidant 2 | 0.012 | 0.03 | 0.5 | 0 | 0 |
| | Curing accelerator | 1.2 | 1.2 | 1.2 | 1.2 | 1.2 |
| | Total | 298.412 | 298.43 | 298.9 | 318.4 | 298.4 |
| Evaluation | Aromatic equivalent X | 0.00002 | 0.00002 | 0.00003 | 0.00062 | 0.00002 |
| | Transmittance (300 nm, 1 mm) | 57.9 | 24.9 | 1 | 69.9 | 75.8 |
| | Transmittance (400 nm, 1 mm) | 96 | 98 | 97 | 93.2 | 96.5 |
| | Transmittance (400 nm, 1 mm) after 168 hours at 150° C. | 91.9 | 91.9 | 94.6 | 90 | 92.2 |

The experimental results in Table 1 show that the resin compositions for sealing an optical semiconductor of Examples 1 to 4 achieved both UV transmission and heat resistance.

In contrast, the comparative examples failed to achieve both UV transmission and heat resistance. Moreover, Comparative Example 5 resulted in poor transmission at 300 nm probably because a primary antioxidant alone was incorporated as an antioxidant and thus the heat resistance during curing was low, so that decomposition was promoted during curing.

INDUSTRIAL APPLICABILITY

The present disclosure relates to a resin composition for sealing an optical semiconductor and a molded resin product for sealing an optical semiconductor each of which can be used to seal an optical semiconductor element. The present disclosure is applicable in the production of an optical semiconductor sealing material or an optical semiconductor device.

The invention claimed is:

1. A resin composition for sealing an optical semiconductor, the resin composition comprising a plurality of aromatic compounds satisfying the following relationship 1:

$$(A1\times A2)/A3+(B1\times B2)/B3+\ldots<0.0005 \quad (1)$$

wherein A1 represents a mass ratio of an aromatic compound, A2 represents a number of aromatic rings per molecule of the aromatic compound, and A3 represents a molecular weight of the aromatic compound; and A, B, . . . each represent an aromatic compound, wherein the resin composition comprises an epoxy, an alicyclic acid anhydride, and an antioxidant, and wherein the resin composition has a linear transmittance at a wavelength of 300 nm of 80% or higher and a linear transmittance at a wavelength of 400 nm of 95% or higher when formed into a cured product by being heated and molded at 150° C. for four minutes and then heated at 150° C. for three hours, the cured product having a size of 50 mm in width, 50 mm in length, and 1 mm in thickness.

2. The resin composition for sealing an optical semiconductor according to claim 1, wherein the epoxy is a compound having a non-aromatic ring structure.

3. The resin composition for sealing an optical semiconductor according to claim 1, wherein the resin composition comprises a release agent.

4. The resin composition for sealing an optical semiconductor according to claim 3, wherein the release agent comprises a molecular structure having a structural unit represented by the following structural formula 2 and a structural unit represented by the following structural formula 3:

$$-\!(CH_2CH_2)_m\!- \quad (2)$$

wherein m is a positive number of 8 to 100;

$$-\!(CH_2CH_2O)_n\!- \quad (3)$$

wherein n is a positive number; and wherein the structural unit of structural formula 3 is set to account for 25 to 95% by mass of the molecular structure as a whole constituting the release agent.

5. The resin composition for sealing an optical semiconductor according to claim 1, wherein the antioxidant is a compound having a phosphite structure.

6. The resin composition for sealing an optical semiconductor according to claim 1, wherein the resin composition is for use in a light-emitting diode.

7. The resin composition for sealing an optical semiconductor according to claim 1, wherein the resin composition is for use in a UV-B light-emitting diode.

8. A molded resin product for sealing an optical semiconductor, the molded resin product comprising the resin composition for sealing an optical semiconductor according to claim 1.

9. An optical semiconductor sealing material, obtained by molding the molded resin product for sealing an optical semiconductor according to claim 8.

10. An optical semiconductor device, comprising:

an optical semiconductor element; and the optical semiconductor sealing material according to claim 9 sealing the optical semiconductor element.

11. The optical semiconductor device according to claim 10, wherein the optical semiconductor element is a light-emitting diode.

12. The optical semiconductor device according to claim 10, wherein the optical semiconductor element is a UV-B light-emitting diode.

* * * * *